(12) United States Patent
Gupta et al.

(10) Patent No.: US 10,832,752 B2
(45) Date of Patent: Nov. 10, 2020

(54) MEMORY WRITE AND READ ASSISTANCE USING NEGATIVE DIFFERENTIAL RESISTANCE DEVICES

(71) Applicant: THE REGENTS OF THE UNIVERSITY OF CALIFORNIA, Oakland, CA (US)

(72) Inventors: Puneet Gupta, Los Angeles, CA (US); Andrew S. Pan, Los Angeles, CA (US); Shaodi Wang, Los Angeles, CA (US)

(73) Assignee: THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 0 days.

(21) Appl. No.: 16/322,407

(22) PCT Filed: Aug. 1, 2017

(86) PCT No.: PCT/US2017/044899
§ 371 (c)(1),
(2) Date: Jan. 31, 2019

(87) PCT Pub. No.: WO2018/026815
PCT Pub. Date: Feb. 8, 2018

(65) Prior Publication Data
US 2019/0198079 A1  Jun. 27, 2019

Related U.S. Application Data

(60) Provisional application No. 62/369,676, filed on Aug. 1, 2016.

(51) Int. Cl.
 *G11C 11/16* (2006.01)
 *G11C 11/56* (2006.01)
 *G11C 13/00* (2006.01)

(52) U.S. Cl.
 CPC ...... *G11C 11/1675* (2013.01); *G11C 11/1659* (2013.01); *G11C 11/1673* (2013.01);
 (Continued)

(58) Field of Classification Search
 CPC ............ G11C 11/1675; G11C 13/0002; G11C 13/0069; G11C 13/004; G11C 11/5614;
 (Continued)

(56) References Cited

U.S. PATENT DOCUMENTS 7,961,534 B2 * 6/2011 Kang ...................... G11C 8/06
                                                     365/175
8,107,280 B2   1/2012 Yoon et al.
(Continued)

OTHER PUBLICATIONS

International Search Report and Written Opinion, issued in corresponding International Application No. PCT/US2017/044899, 10 pages (dated Dec. 4, 2017).
(Continued)

*Primary Examiner* — Gene N Auduong
(74) *Attorney, Agent, or Firm* — Foley & Lardner LLP (57) ABSTRACT

A random access memory (RAM) includes a bit-line, a source-line, a memory cell connected to the bit-line and the source-line, and a read/write circuit connected to the bit-line and the source-line and including a negative differential resistance (NDR) device.

19 Claims, 6 Drawing Sheets

(52) U.S. Cl.
CPC ...... *G11C 11/5614* (2013.01); *G11C 13/0002* (2013.01); *G11C 13/004* (2013.01); *G11C 13/0069* (2013.01); *G11C 2213/15* (2013.01); *G11C 2213/74* (2013.01); *G11C 2213/76* (2013.01); *G11C 2213/78* (2013.01); *G11C 2213/79* (2013.01); *G11C 2213/82* (2013.01)

(58) Field of Classification Search
CPC ............ G11C 11/1673; G11C 11/1659; G11C 2213/76; G11C 2213/82; G11C 2213/79; G11C 2213/78; G11C 2213/74; G11C 2213/15
See application file for complete search history.

(56) References Cited

U.S. PATENT DOCUMENTS

| | | | |
|---|---|---|---|
| 8,525,553 | B1 | 9/2013 | Yi et al. |
| 8,605,496 | B2 * | 12/2013 | Kang ............... G11C 8/06 365/148 |
| 2004/0006441 | A1 | 1/2004 | Rickes et al. |
| 2006/0007773 | A1 | 1/2006 | King |
| 2014/0117304 | A1 | 5/2014 | Park |
| 2015/0054090 | A1 | 2/2015 | Or-Bach et al. |
| 2015/0364187 | A1 | 12/2015 | Kim et al. |

OTHER PUBLICATIONS

Chen et al. "A nondestructive self-reference scheme for spin-transfer torque random access memory (STT-RAM)," Proc. Date. IEEE. 2010.

Eken et al. "A New Field-assisted Access Scheme of STT-RAM with Self-reference Capability," Proceedings of the 51st Annual Design Automation Conference. ACM. 2014.

International Preliminary Report on Patentability issued in PCT/US2017/044899 dated Feb. 14, 2019, 7 pages.

Klostermann et al. "A perpendicular spin torque switching based MRAM for the 28 nm technology node," Electron Devices Meeting (IEDM), IEEE International. IEEE. 2007, pp. 187-190.

Zhou et al. "Energy reduction for STT-RAM using early write termination," ICCAD. IEEE. 2009.

* cited by examiner

MEMORY WRITE AND READ ASSISTANCE USING NEGATIVE DIFFERENTIAL RESISTANCE DEVICES

CROSS-REFERENCE TO RELATED APPLICATION

This application is a national stage entry of International Application No. PCT/US2017/044899, filed on Aug. 1, 2017, which claims the benefit of U.S. Provisional Application No. 62/369,676, filed on Aug. 1, 2016, the content of which are incorporated herein by reference in their entireties.

TECHNICAL FIELD

This disclosure generally relates to improving the performance of memory write and read operations using negative differential resistance devices.

BACKGROUND

Non-volatile memories including phase-change memory (PCM) and Flash memory are broadly used for data storage. Other emerging memory technologies like magnetic random access memory (MRAM), conductive bridge memristive memory (CBM), and non-resistive charge-trapping memory (CTM) are promising storage, cache, and computing elements in future computing systems.

Figure 1:
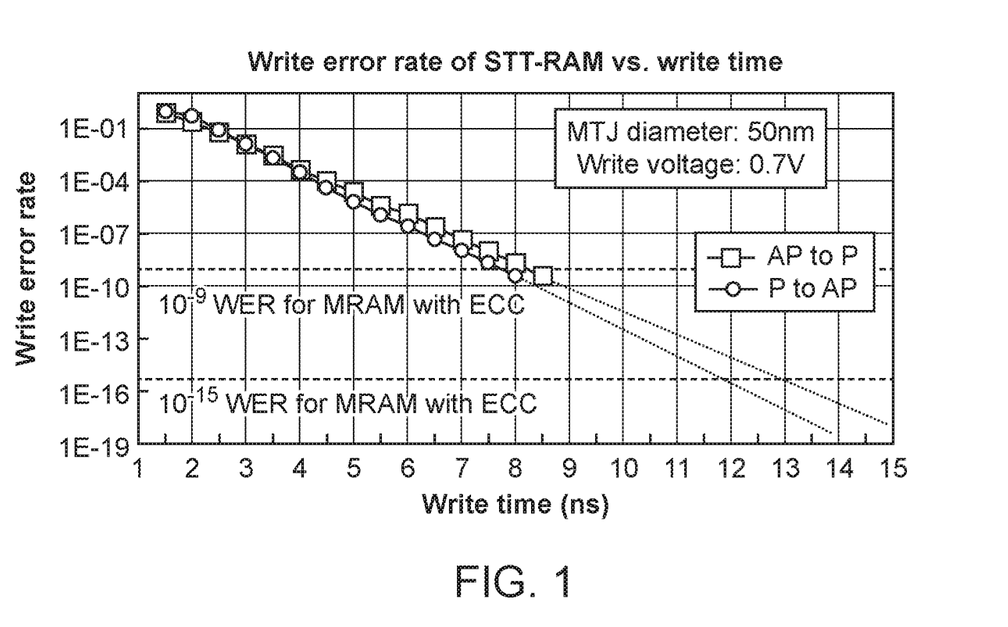
FIG. 1: Simulated write error rate as a function of write time of MRAM.

However, many drawbacks exist for these technologies, for example, high programming energy in MRAM, CBM, Flash, and PCM, undetermined programmed resistance in CBM, and low read margin and read disturbance in MRAM. For the specific example of MRAM, FIG. 1 shows an example of stochastic write in spin-transfer torque (STT) MRAM, where the write error rate (WER) of a 40 nm MRAM cell (one magnetic tunnel junction (MTJ) and a transistor) behaves as a function of write time, assuming a substantially constant write current of about 100 µA. Over 10 ns long write times and high write energies are involved to bring WER to the level that can be protected by error correction code (ECC).

Various solutions have been proposed for each of these problems, at the cost of new complications. To take MRAM as one representative example, early write termination has been proposed to reduce write energy by detecting MRAM cell state switching through bit-line voltage changes. However, this technique involves substantial sensing and control circuitry overhead and is impractical for STT-MTJ with low resistance (namely, the STT-MTJ is designed with low resistance to reduce write current). To reduce read disturbance, sensing current may be decreased, but this compromises sensing margin, which specifies high sensing current. Alternatively, sensing designs have been proposed to improve the margin, with modest benefits. For example, a local-reference reading scheme is proposed to reduce the effects of wafer-level variation, while self-reference schemes are proposed to inoculate against process variations. Such methods can mitigate the process variation impact. However, the improved margin is still constrained by low device tunnel magnetoresistance (TMR), such that TMR of about 100%, for example, can achieve about 26% difference in sensing current.

It is against this background that a need arose to develop the embodiments described herein.

SUMMARY

In some embodiments, a random access memory (RAM) includes: 1) a bit-line; 2) a source-line; 3) a memory cell connected to the bit-line and the source-line; and 4) a read/write circuit connected to the bit-line and the source-line and including a negative differential resistance (NDR) device.

In some embodiments of the RAM, the memory cell is a resistive memory cell.

In some embodiments of the RAM, the NDR device is connected in series with the memory cell with a path of a current.

In some embodiments of the RAM, during a read operation, the read/write circuit is configured to generate a read current through the memory cell, and the NDR device is connected in series with a path of the read current.

In some embodiments of the RAM, during a write operation, the read/write circuit is configured to generate a write current through the memory cell, and the NDR device is connected in series with a path of the write current.

In some embodiments of the RAM, the read/write circuit further includes a sensing circuit connected to the bit-line, and the sensing circuit is configured to compare a voltage on the bit-line to a reference voltage.

In some embodiments of the RAM, the memory cell is a resistive memory cell, and the NDR device is a voltage-controlled NDR (V-NDR) device, in which V-NDR characteristics are configured for the resistive memory cell with multiple stable solutions when the resistive memory cell is in its high resistance state and one stable solution when the resistive memory cell is in its low resistance state.

In some embodiments of the RAM, the memory cell is a resistive memory cell, and the NDR device is a V-NDR device to provide write termination when the resistive memory cell is switched to its low resistance state.

In some embodiments of the RAM, the memory cell is a resistive memory cell, and the NDR device is a current-controlled NDR (C-NDR) device to provide write termination when the resistive memory cell is switched to its high resistance state.

In some embodiments of the RAM, the NDR device is a C-NDR including a Schmitt trigger and a metal-oxide-semiconductor field-effect transistor (MOSFET).

In additional embodiments, a method of programming a multi-level-cell memory includes: 1) providing multiple NDR devices having different, respective NDR characteristics; 2) selectively connecting a first one of the NDR devices in series with a multi-level cell; and 3) generating a write current through the multi-level cell and the first one of the NDR devices.

In some embodiments of the method, a number of the NDR devices is at least 3.

In some embodiments of the method, the NDR devices have different, respective peak currents.

In some embodiments of the method, the method further includes selectively connecting a second one of the NDR devices in series with the multi-level cell, and generating a write current through the multi-level cell and the second one of the NDR devices.

In some embodiments of the method, the method further includes selectively connecting a third one of the NDR devices in series with the multi-level cell, and generating a write current through the multi-level cell and the third one of the NDR devices.

In additional embodiments, a method of programming a multi-level-cell memory includes: 1) providing a NDR device connected in series with a multi-level cell, the NDR device being tunable according to a control bias; 2) applying the control bias to the NDR device to specify a first NDR characteristic of the NDR device; and 3) generating a write current through the multi-level cell and the NDR device having the first NDR characteristic to program the multi-level cell to a first state.

In some embodiments of the method, the method further includes applying the control bias to the NDR device to specify a second NDR characteristic of the NDR device, and generating a write current through the multi-level cell and the NDR device having the second NDR characteristic to program the multi-level cell to a second state.

In some embodiments of the method, the method further includes applying the control bias to the NDR device to specify a third NDR characteristic of the NDR device, and generating a write current through the multi-level cell and the NDR device having the third NDR characteristic to program the multi-level cell to a third state.

In some embodiments of the method, the first, second, and third NDR characteristics correspond to different peak currents of the NDR device.

In some embodiments of the method, the first, second, and third states correspond to different resistance states of the multi-level cell.

In additional embodiments, provided are a system and a method of write termination using V-NDR for a single-level-cell memory.

In additional embodiments, provided are a system and a method of read margin improvement in a memory using V-NDR.

In additional embodiments, provided are a system and a method of read disturbance reduction in a memory using V-NDR.

In additional embodiments, provided are a system and a method of write termination in a memory using C-NDR to provide write termination when a memory cell is switched towards its higher resistance state.

In additional embodiments, provided are a system and a method of improving performance of write and read operations of a memory using a C-NDR device, which includes a Schmitt trigger and a MOSFET.

In additional embodiments, provided are a system and a method of programming using V-NDR or C-NDR for a multi-level-cell memory.

In additional embodiments, provided are a system and method of programming using V-NDR or C-NDR for multi-level analog computing memory.

Other aspects and embodiments of this disclosure are also contemplated. The foregoing summary and the following detailed description are not meant to restrict this disclosure to any particular embodiment but are merely meant to describe some embodiments of this disclosure.

BRIEF DESCRIPTION OF THE DRAWINGS

For a better understanding of the nature and objects of some embodiments of this disclosure, reference should be made to the following detailed description taken in conjunction with the accompanying drawings.

FIG. 3: (a) and (b): Examples of emulated two-terminal V-NDR devices using complementary metal-oxide-semiconductor (CMOS). (c) and (d): Examples of emulated three-terminal V-NDR devices using CMOS.

FIG. 4: (a) A series connection example of an MTJ and a V-NDR device. (b) V-NDR and MTJ current as a function of voltage drop across the NDR device $V_{NDR}$ for MTJ in AP state ($R_H$ lower dashed curve) and P state ($R_L$ upper dashed curve). Two stable current solutions in AP state are indicated by solid dots, and one solution in P state is indicated by solid dot.

FIG. 7: (a) V-NDR in a read circuit design. (b) Simulation of read operations. The discharging current ($I_{NDR}$) difference for sensing MTJ states is significantly increased by the high PVR of NDR. A large and substantially constant voltage margin is achieved on the bit-line ($V_{bit-line}$), which is sensed by a constant reference voltage leading to a stable sense amplifier output ($V_{output}$).

FIG. 9: (a) I-V curves of CBM and different sized NDR devices. The final programmed resistance is determined by the peak current of V-NDR device. (b) Simulated programming waveforms of write voltage ($V_{CC}$), write current ($I_{Write}$), and resistance of a CBM cell ($R_{Cell}$) as functions of time.

FIG. 10: (a) Example of a current-controlled NDR (C-NDR) device using a Schmitt trigger and an n-type MOSFET (NMOS) transistor. (b) I-V curves of C-NDR.

FIG. 11: (a) The I-V curves of NMOS and CBM cell resistance. (b) Simulated waveforms of CBM resistance programming using C-NDR. The programmed resistance is determined by the size of NMOS and the ThL in C-NDR.

DETAILED DESCRIPTION

Some embodiments of this disclosure are directed to improving the performance of resistive memories, such as PCM, MRAM including STT-MTJs, magnetoelectric RAM (MeRAM), and resistive switching RAM (ReRAM) including CBM, as well as improving the performance of threshold voltage switching memories. Some embodiments are described in the context of STT-MRAM and CBM as particular example applications, although it is noted that embodiments of this disclosure are generally applicable to any resistive memory where a memory cell is switched between high and low resistance states by electrical bias, namely, where the STT-MTJ in these examples is replaced by the corresponding resistive memory element.

I. Voltage-Controlled Negative Differential Resistance (V-NDR) in MRAM

As an example, for STT-MRAM, some embodiments provide a design to simultaneously resolve all three main challenges in STT-MRAM: high write currents, low sensing margins, and susceptibility to read disturbance, with low overhead. By introducing voltage-controlled negative differential resistance (V-NDR) devices, which may be single semiconductor structures such as tunneling field-effect transistors (TFETs) and tunneling diodes (TDs) or circuits designed to yield NDR in their output nodes such as complementary metal-oxide-semiconductor (CMOS)-V-NDR (FIG. 3), into read and write circuitry, redundant write current can be reduced and a current difference between high and low MTJ states can be amplified. As a result, the design can greatly reduce read energy, write energy, and read disturbance current while increasing sensing margin and simplifying a sensing circuit, thus affording truly low power memory technology. For example, some embodiments of the design can improve the write and read energy efficiency by about 2× (or more) and about 7.7× (or more) respectively, improve sensing margin by about 3.5× (or more), and substantially reduce the read disturbance. The design does not require changes in STT-MRAM architectures and can involve a modest footprint addition of a single NDR device for every set of bit-lines of MTJs sharing a sense amplifier. In some embodiments, a read/write circuit includes a read NDR device to support read operations and another write NDR device to support write operations, and, in other embodiments, a common NDR device is included to support both read operations and write operations. Other types of resistive switching memories face similar problems of high write currents, low sensing margins, and susceptibility to read disturbance, for which embodiments of the design are also applicable, with a change of memory cell components.

STT and NDR Device Characteristics

A. Spin-Transfer Torque Magnetic Tunneling Junctions

In these examples, a STT-MTJ is a resistive memory whose resistance is determined by the magnetization directions of two ferromagnetic layers. The direction of one layer (referred to as the reference layer) is fixed while the other one (the free layer) can be switched. A low resistance $R_L$ is present when the magnetization directions of the two layers are substantially parallel (the P state), while a high resistance $R_H$ is realized when the two directions are substantially anti-parallel (the AP state). These two states are utilized to store "0" and "1." In example demonstrations, the electrical characteristics of a SIT-MTJ with diameter of 40 nm are modeled using a Landau-Lifshitz-Gilbert (LLG) differential equation solver.

B. V-NDR Devices

Figure 2:
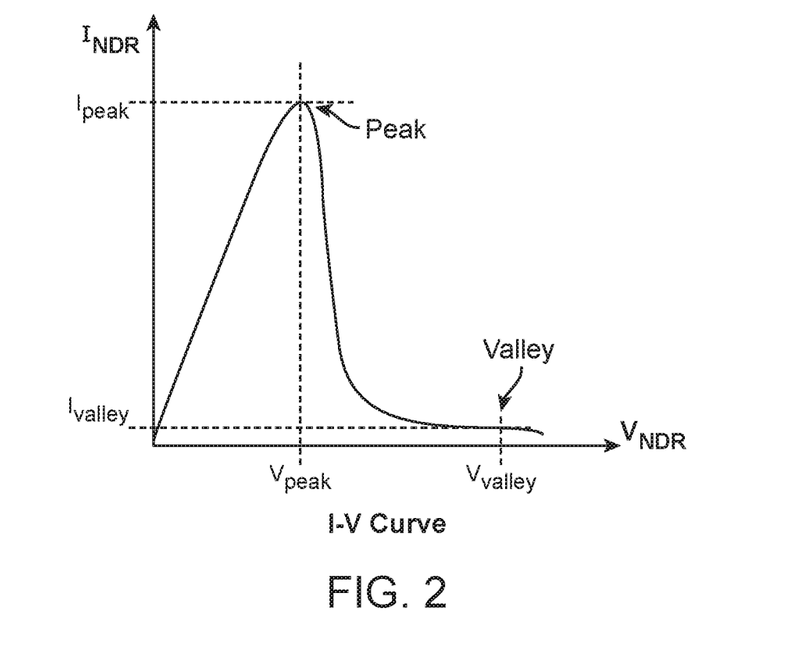
FIG. 2: Schematic I-V for voltage-controlled negative differential resistance (V-NDR) device.

As illustrated in FIG. 2, V-NDR devices are two- or three-terminal electronic devices which have the property that within a certain bias range (between $V_{peak}$ and $V_{valley}$), the absolute current decreases with increased absolute voltage. The ratio of the maximum and minimum currents ($I_{peak}$ and $I_{valley}$, respectively) within this range is referred to as the peak-to-valley ratio (PVR). One way for generating V-NDR in semiconductor devices is via quantum tunneling, because of its potential for high PVR. A variety of two- and three-terminal devices, including Esaki diodes, resonant TDs (RTDs), and TFETs, can be used for this purpose. In two-terminal devices like Esaki diodes and RTDs, a current through a device is modulated by an applied voltage between two terminals. Esaki diodes utilize a bias-dependent onset of interband tunneling to achieve NDR, whereas RTDs fulfill this purpose by voltage control of energy of quantum resonances in an active region. In TFETs, NDR occurs in the source-to-drain current as a function of the drain-to-source voltage, although the values of $V_{peak}$, $V_{valley}$, $I_{peak}$, and $I_{valley}$ may be changed by the gate voltage. TFETs in some respects can behave like gated Esaki diodes; if the gate voltage is high enough to electrostatically induce a tunnel junction between the source and the channel, application of a negative bias between the drain and the source will act to turn off tunneling, leading to NDR. TFETs have the advantage that NDR in the drain current can be activated or deactivated by the gate voltage, acting like a switchable tunnel diode. In Table I, characteristics of some TFETs and TDs are provided.

TABLE I

Experimental characteristics of selected NDR tunneling devices. Peak current is expressed in terms of per unit width for TFETs and per unit area for TDs.

| Device | Material | Substrate | Peak Current | PVR |
| --- | --- | --- | --- | --- |
| TD | Si/SiGe | Si | 50 µA/µm² | 6 |
| TD | InGaAs | Si | 2.5 µA/µm² | 56 |
| TD | InGaAs/InAlAs | InP | 2 µA/µm² | 144 |
| TFET | InAs/AlSb/GaSb | GaSb | 230 µA/µm | 5.5 |
| TFET | InGaAs/InAs | InP | 4 µA/µm | 6.2 |

Figure 3:
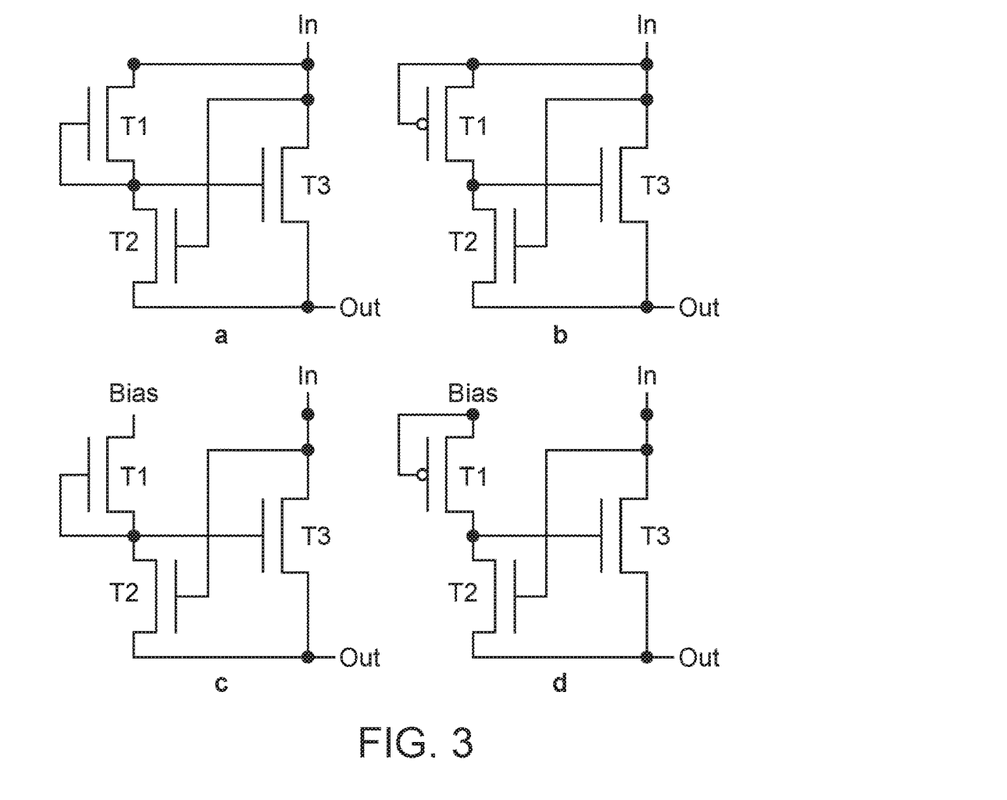

In addition to the use of standalone devices like RTDs and TFETs, V-NDR characteristics can also be obtained using appropriate CMOS V-NDR emulator circuits. Four example designs for such circuits are shown in FIG. 3, which use three metal-oxide-semiconductor field-effect transistors (MOSFETs) T1, T2, and T3 connected so that NDR will be produced in the current as the voltage between input and output terminals is modulated. In FIGS. 3(a) and (b), the emulator circuit produces two-terminal NDR between the input and output terminals, differing in the choice of an n-type MOSFET (NMOS) or a p-type MOSFET (PMOS) device as T1, respectively. In these designs, T1 acts as an effective resistance; initially as the voltage between the input and output terminals increases, T3 will be in the on-state and current will increase. Eventually, when the input voltage increases to the point that T2 is turned on, the gate voltage for T3 will float down, and T3 will turn off, shutting off current and leading to NDR. The valley current will be determined by the leakage current flowing through the series connection of T1 and T2. For each circuit, the PVR can be modulated by changing threshold voltages of one or more of T1, T2, and T3. Three-terminal V-NDR characteristics can also be emulated in circuit designs, such as the configurations shown in FIGS. 3(c) and (d), where changes in the voltage applied to a bias terminal can modulate the peak and valley currents attained at the input and output terminals. The operation is similar to the circuits in FIGS. 3(a) and (b), but modulation of the bias terminal voltage changes the effective resistance of T1, altering the peak voltage and the peak and valley currents of the NDR operation. Other CMOS V-NDR emulator circuit designs besides the schematics in FIG. 3 are also encompassed by this disclosure. RTDs, TFETs, and the CMOS-V-NDR circuits in FIG. 3 are provided as example V-NDR devices, and embodiments of this disclosure can be applied using other types of two- or three-terminal NDR devices, regardless of their physical mechanism or construction, provided their NDR characteristics can be tuned to fit a desired operating window.

C. Behavior of Series-Connected MTJ and V-NDR Device

Figure 4:
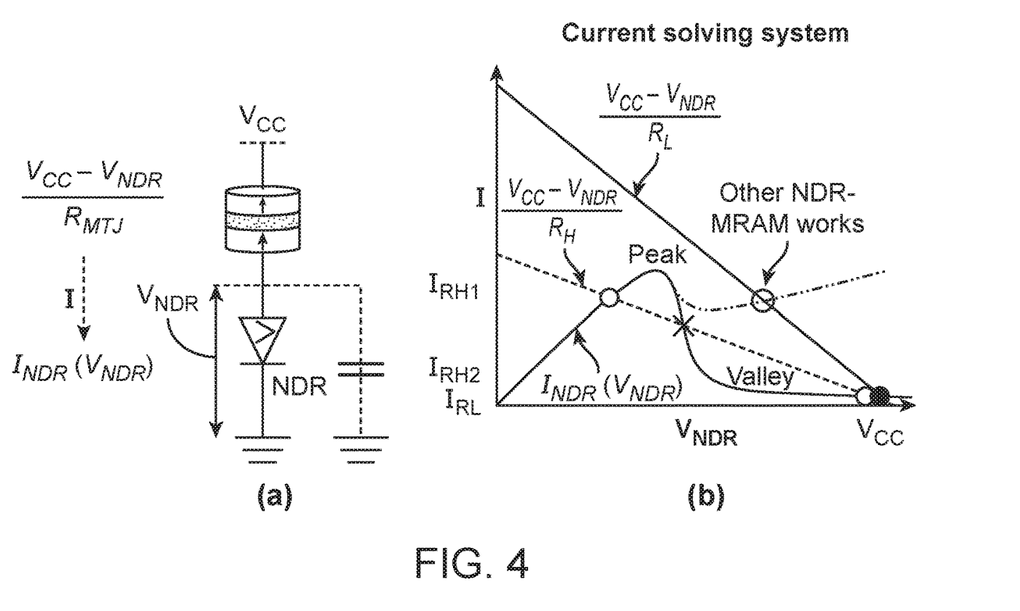

A basic concept of some embodiments is that the circuit behavior of a properly selected V-NDR device connected in series with a resistive memory cell, such as an MTJ, can lead to a greater difference in the current when the state of the MTJ is switched. To demonstrate the basic concept, a series connection of an MTJ and a V-NDR device is evaluated, as shown in FIG. 4a. The MTJ is treated as a resistor such that current is $(V_{CC}-V_{NDR})/R_{MTJ}$, where $R_{MTJ}=R_H$ or $R_L$ depending on its magnetization state. In FIG. 4b, the current passing through the V-NDR device (solid line) and the MTJ (dotted lines) is plotted as functions of the voltage across the V-NDR device $V_{NDR}$. The intersections of the V-NDR and MTJ curves represent the possible solutions of the circuit. First considering the AP MTJ state, in the presence of any capacitance between the MTJ and the NDR device, the left and right solutions (solid dots) can be demonstrated to be asymptotically stable (in the sense of being convergent values of current over time) according to Lyapunov's second method, while the middle solution (cross) is unstable. This means that when $V_{NDR}$ is below $V_{peak}$, the circuit current will converge to the crosspoint to the left of $V_{peak}$, whereas if $V_{NDR}$ is greater than $V_{peak}$, the current will converge to the valley current. However, if the MTJ is in the low resistance P state, one stable solution exists in the low current valley as illustrated by the solid dot in FIG. 4b. In some embodiments, the V-NDR and AP MTJ curves have three intersections (three solutions), which allows the intersection of V-NDR and P MTJ to be a very low current, such that the V-NDR device has a high PVR. Other V-NDR and MTJ operate by allowing just one intersection for either P MTJ or AP MTJ. Due to the design difficulty and process variation constraints, the intersections between MTJ and those V-NDR devices are high currents, and those V-NDR devices typically cannot have as high PVR as the V-NDR devices of embodiments of this disclosure (FIG. 4b).

Figure 5:
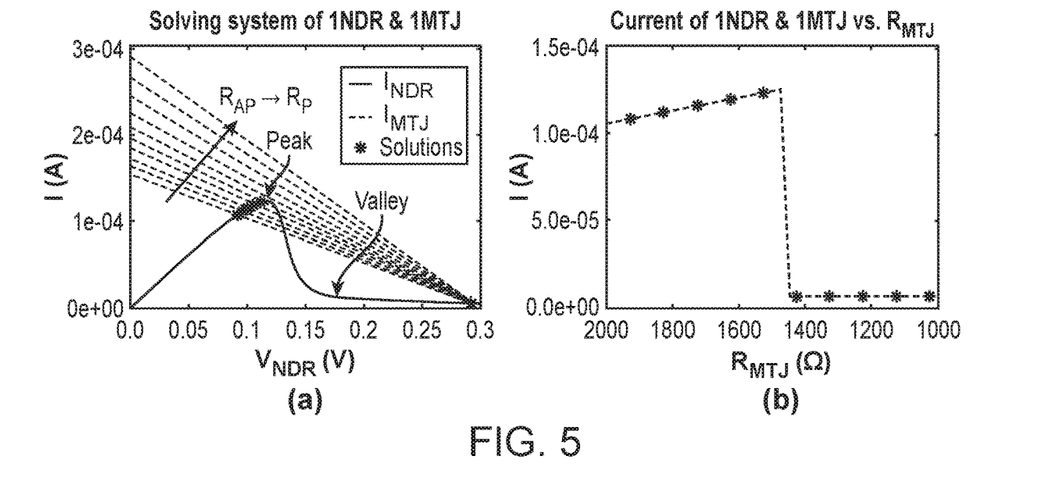
FIG. 5: Interaction of V-NDR device and MTJ. (a) $I_{NDR}$ vs. $V_{NDR}$ and $I_{MTJ}$ vs. ($V_{CC}-V_{NDR}$) for different $R_{MTJ}$. (b) Current of the series connection of MTJ and V-NDR device vs. $R_{MTJ}$.

For the specific devices considered in this demonstration, the V-NDR device current (solid line) and MTJ currents (dashed lines) for decreasing MTJ resistance are plotted in FIG. 5a. At the beginning of the process the MTJ is in the AP state and the current is high. Upon switching to the P state, the MTJ resistance decreases and current increases past the peak point, leading to a sharp drop to the valley current region. The stabilized current in this process is shown in FIG. 5b as a function of $V_{CC}$. These observations show that, given proper choice of the peak and valley currents, the V-NDR device can sense different MTJ resistance states and switching therein and adjust the current through the circuit accordingly. For sufficiently large PVR, the resulting difference in the series-connected circuit can be much greater than the ratio of the high and low resistances of the MTJ itself.

These observations can drive the design for memory read and write circuitry where a V-NDR device is included in series with a write or read current path of a memory cell. Taking the case of an MTJ as an example, since the MTJ has two resistance states, the write or read voltage to bias the write or read current to the peak current of the NDR device is different. For a given NDR device and MTJ, the write/read voltage should be chosen so that the current through the high-resistance state is at or close to the peak current of the V-NDR device, and the current through the low-resistance state is at or close to the valley current of the V-NDR device. Alternatively, given a write/read voltage, the V-NDR device should be chosen (e.g., by sizing the device or shifting the gate voltage for TFETs or three-terminal CMOS V-NDR circuits) so that the current through the high-resistance state is at or close to the peak current of the V-NDR device, and the current through the low-resistance state is at or close to the valley current of the V-NDR device.

STT-MRAM Write Energy Reduction

Figure 6:
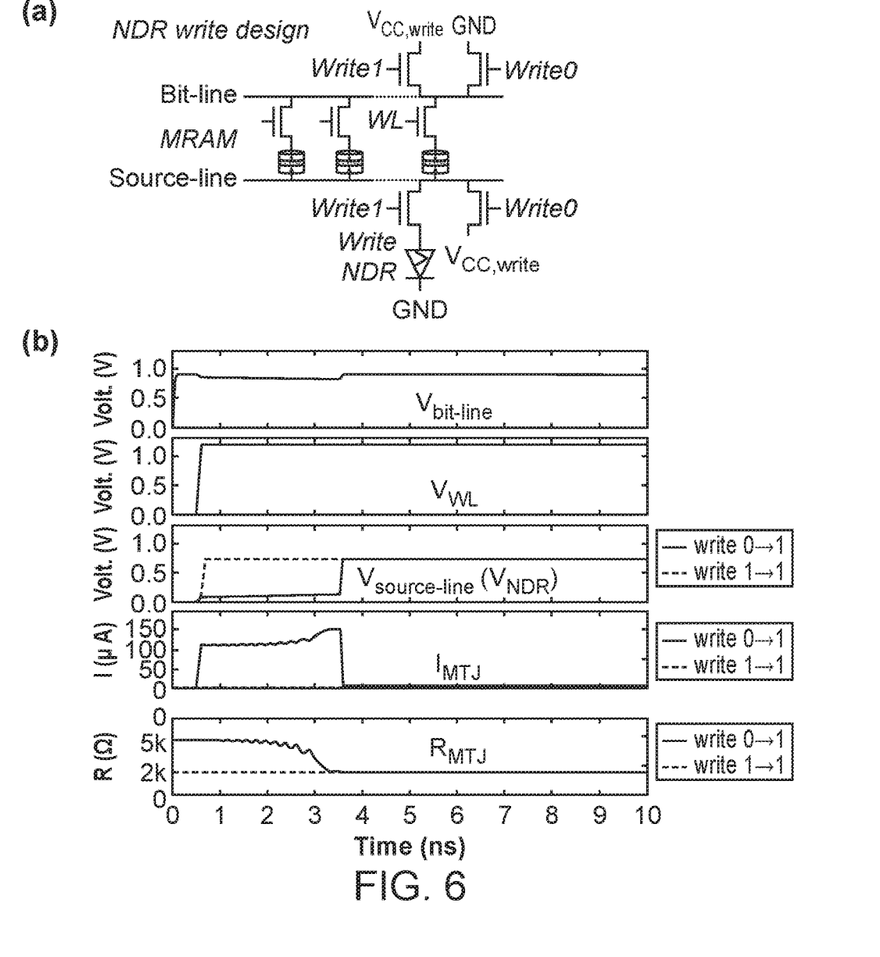
FIG. 6: Design of early write current cut-off using V-NDR. (a) Write circuit schematic with one V-NDR device. (b) Simulated waveforms of MTJ resistance change ($R_{MTJ}$), write current ($I_{MTJ}$), source-line voltage (V-NDR dropped voltage, $V_{NDR}$) and write control signal ($V_{WL}$) in early write current cut-off applications for writes from AP to P (0 to 1) and from P to P (1 to 1) are shown.

Having established that V-NDR devices can introduce large current drops upon switching of a serially connected MTJ, this effect can be implemented to automatically perform early write current cut-off when STT-MTJs switch to or stay in the P state. A schematic write circuit is shown in FIG. 6a, showing the addition of a V-NDR device (e.g., TFET or TD) to a STT-MRAM write circuit, which includes a first pair of transistors to write to the 1 state (one of which is connected between $V_{CC,write}$ and a bit-line, and another of which is connected in series with the V-NDR device and between a source-line and a ground voltage), and a second pair of transistors to write to the 0 state (one of which is connected between $V_{CC,write}$ and the source-line, and another of which is connected between the bit-line and a ground voltage). The footprint overhead of this addition is modest since, like a sense amplifier, a single V-NDR device can share connections to multiple MTJ bit-lines since just one MTJ cell is activated (through a word-line (WL) or selection transistor) at a time during a write or read operation. During writing of an MTJ from the AP to the P state, this configuration can automatically cut off the write current once the P state is attained and the voltage drop across the V-NDR device ($V_{NDR}$) enters the valley region. By contrast, if a write-to-P operation is performed on an MTJ already in the P state, the NDR device forces a very low write current during the entire write operation to avoid energy waste.

The proposed design effectively performs early write termination. To illustrate this, in FIG. 6b, the waveforms of bit-line voltage ($V_{bit-line}$), bit selection (WL), voltage drop on NDR ($V_{source-line}$), write current ($I_{MTJ}$), and MTJ resistance ($R_{MTJ}$) are shown under early write termination. If the MTJ starts in the 0 state, the NDR device voltage and current increase to near $V_{peak}$ and $I_{peak}$, respectively, after the WL goes high and stays there until the MTJ switches, whereupon the NDR voltage approaches $V_{CC}$, turning off the write current. If the MTJ is initially in the 1 state, the NDR directly goes to $V_{CC}$ after the WL goes high and cuts off the write current. A prerequisite for current cut-off operation in some embodiments of the design is that $V_{NDR}$ at the beginning of the write operation is lower than $V_{peak}$ of the NDR device.

STT-MRAM Read Assistance Using V-NDR

The sensing margin in STT-MRAM can be constrained by low MTJ TMR and can be further reduced in practice by process variations; this issue has led to proposals to enhance sensing margin within these constraints. By utilizing V-NDR, the current difference ratio can be amplified above the device TMR to the PVR of the V-NDR device, substantially increasing sensing margins and reducing the sensitivity to process variations. For example, the high-to-low resistance ratio of an MTJ can be about 2 to about 3, where the sensing current ratio is about 1.3 to about 1.6. By serially connecting a V-NDR device to the sensing current path, the current difference between two MTJ states can be increased to the V-NDR device's PVR, which can be significantly higher than the original current difference ratio. This design increases sensing margin, which reduces read difficulty, delay, energy, and errors.

A. Read Margin Improvement

Figure 7:
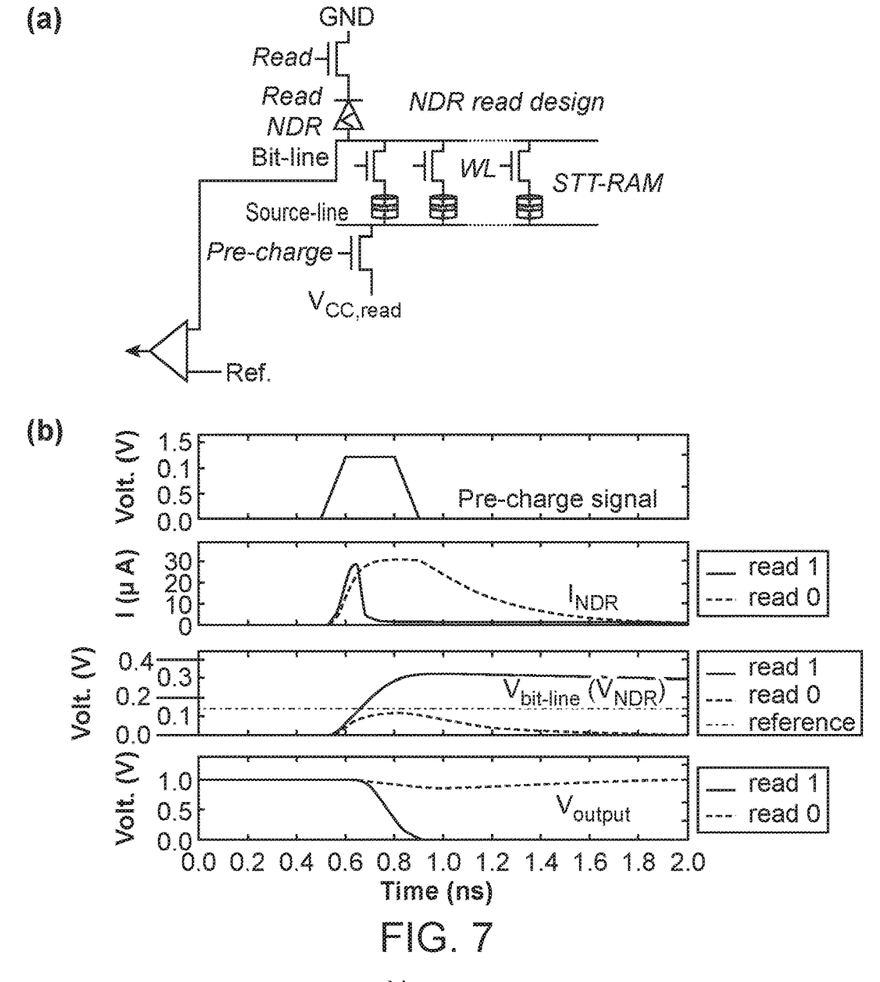

Similar to the earlier discussed series connection example, which illustrates that V-NDR devices can differentiate the state of a serially connected MTJ (FIG. 4), a read circuit design is proposed in which multiple bit-lines share a single V-NDR device, as shown in FIG. 7a. The read circuit includes a pair of transistors to read a state of the MTJ (one of which is connected between $V_{CC,read}$ and a source-line, and another of which is connected in series with the V-NDR device and between a bit-line and a ground voltage). During a read operation, the MTJ selection transistor and the V-NDR device are turned on prior to pre-charging. This sequence ensures that $V_{NDR}$ is close to zero at the beginning of the read operation. The V-NDR device dimensions are selected such that its peak current $I_{peak}$ is larger than the current through the AP state but smaller than that of the P state. Therefore, when the AP state is sensed, the V-NDR stays in a low-resistance region because the current through AP-state MTJ is always smaller than $I_{peak}$. When the P state is sensed, the transient current through the MTJ in the pre-charge is larger than $I_{peak}$, pushing the V-NDR device into its high-resistance region and cutting off the discharging (sensing) current.

As shown in FIG. 7a and FIG. 7b, the bit-line is sensed (through a sense amplifier) in the proposed V-NDR-assisted design by comparing with a constant reference voltage. When the AP state is sensed, the V-NDR device stays in its low resistance region below the peak and the bit-line cannot be charged up. When the P state is sensed, the transient current through the MTJ in the pre-charge stage will exceed $I_{peak}$, pushing the V-NDR device into its high-resistance valley region so that the discharging (sensing) current is cut off.

B. Read Disturbance Reduction

Read disturbance is a reliability concern which is caused by false switching of an MTJ via large sensing current through the memory cell. To reduce read disturbance, other designs reduce read current as well as sensing margin, resulting in larger sensing circuits (large gate sizes and more sensing transistors), longer sensing time, and higher sensing energy. The read design with NDR substantially removes read disturbance without additional overhead. As shown in FIG. 7a, read disturbance can occur when the sensing current occasionally switches a STT-MTJ from the P to AP state, namely, an AP state MTJ generally cannot be switched due to the sensing current direction that is selected in such a way that any switching of the MTJ by the sensing current is from the P to AP state (for example, opposite direction to write current). In the proposed design, the sensing current through the AP-state MTJ is high but does not introduce false switching, while the sensing current through a P-state MTJ forces the NDR device to enter its valley region, dramatically reducing the discharging current and thus the probability of false switching.

II. Precise Multi-Level Resistance Programming

Many resistive memories use multiple resistance levels to improve data density, including MRAM, memristors, and PCM. Other memory technologies like Flash and CTM use multi-level threshold voltages for data storage, which corresponds to multiple source-to-drain resistance values. The typical programming technique for these technologies is to use multiple cycles of write and read checks to achieve the target resistance, which is slow and high-energy-consuming.

By contrast, V-NDR and current-controlled NDR (C-NDR) can be used to precisely, efficiently, and quickly program multi-level resistances. Some example embodiments below use CBM as the example memory technology, but embodiments are generally applicable to other memory technologies including Flash, PCM, and CTM.

A. Multi-Level Resistance Programming Using V-NDR

CBM is a prototypical memristor technology whose resistance can change over 1000×, and whose resistance remains substantially unchanged during its idle state. In addition to memory and storage, it can also be used for analog computing, for example, in memristor cross-bar based matrix multiplier, which is an accelerator for deep learning applications. In those applications, more than hundreds of resistance values may be used, and the resistance values should be specified precisely.

Figure 8:
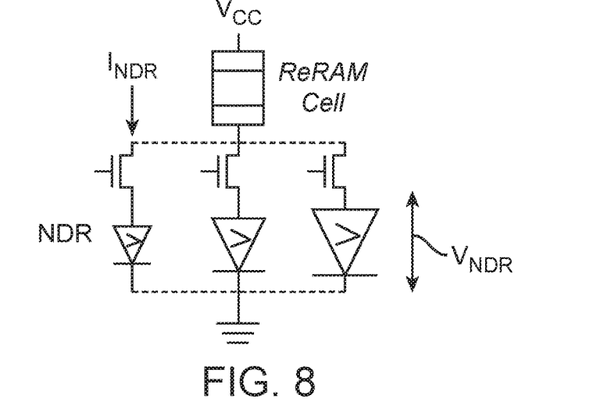
FIG. 8: To program different resistance of a CBM (resistive switching RAM (ReRAM)) cell, different sized NDR devices are serially connected. The target resistance is determined by the selected NDR device.
Figure 9:
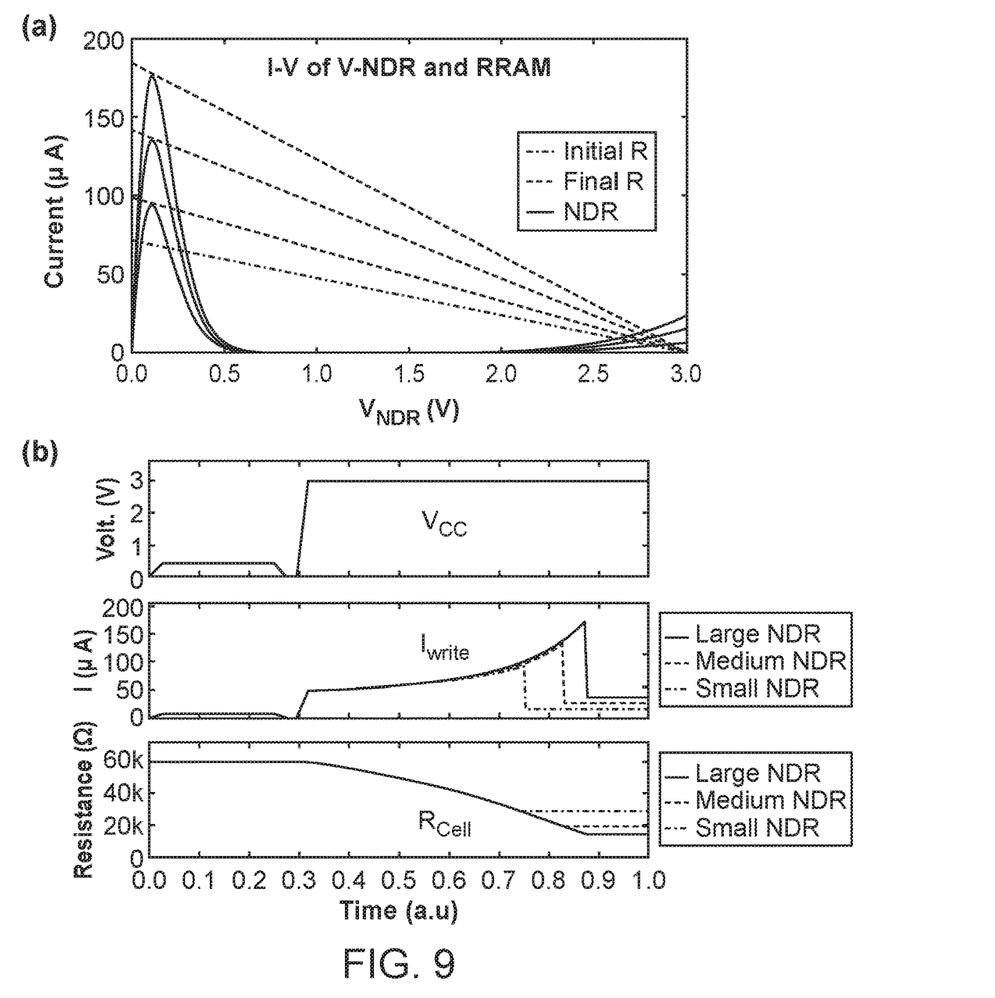

It has been explained above that a properly selected V-NDR device in series with a resistive element can sharply differentiate between resistance values, where the differentiation point is set by NDR characteristics like peak current, which may be tuned either by external biasing (for TFETs or CMOS-NDR circuits, for example), or by device sizing. Therefore, if multiple (e.g., more than two) resistance states are to be differentiated, the resistive element may be serially connected to multiple V-NDR devices, each one tuned for a specific resistance value. When a particular resistance is programmed, the corresponding V-NDR device is selected. As an example, FIG. 8 shows a CBM cell serially connected with three differently sized V-NDR devices through respective selection transistors between $V_{CC}$ and a ground voltage. During resistance programming, just one V-NDR is selected through its respective selection transistor. As shown in FIG. 9a, initial resistance is a high value, which has a high-current intersection with V-NDR devices. With the write current flowing through the CBM cell, resistance decreases, and the write current increases. The resistance continues to decrease until the write current reaches the peak current of the V-NDR device, then write current drops to the valley current of the V-NDR device, and the programming ends. As is seen in FIG. 9a, three final resistances are determined by the peak currents of the three V-NDR devices. FIG. 9b shows the simulated waveforms of write voltage, write currents, and cell resistance as functions of time. With three different sized V-NDR devices, V-NDR devices turn off, and the programming ends at different times with different final resistances.

Figure 10:
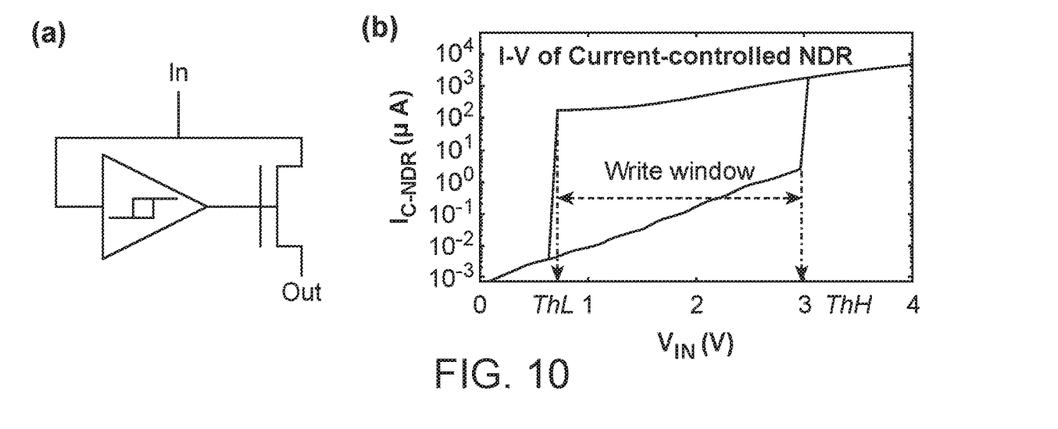

As a complement to V-NDR, C-NDR can program resistive memory cells from low resistance to high resistance, in contrast to V-NDR which provides advantages when programming to low resistance. FIG. 10a shows an example of a C-NDR device, including a Schmitt trigger and an NMOS transistor. The Schmitt trigger has two threshold voltages: ThH and ThL. When input of the Schmitt trigger increases from 0 and passes the high threshold voltage (ThH), the output of the Schmitt trigger jumps from 0 to $V_{CC}$. On the other hand, when input voltage decreases from a large voltage and drops below the low threshold voltage (ThL), the output drops from $V_{CC}$ to 0. The NMOS transistor is controlled by the Schmitt trigger by connection through the gate of the NMOS transistor, and the resulting I-V curve of the C-NDR is shown in FIG. 10b, where high current is available when the C-NDR device dropped voltage between ThL and ThH.

Figure 11:
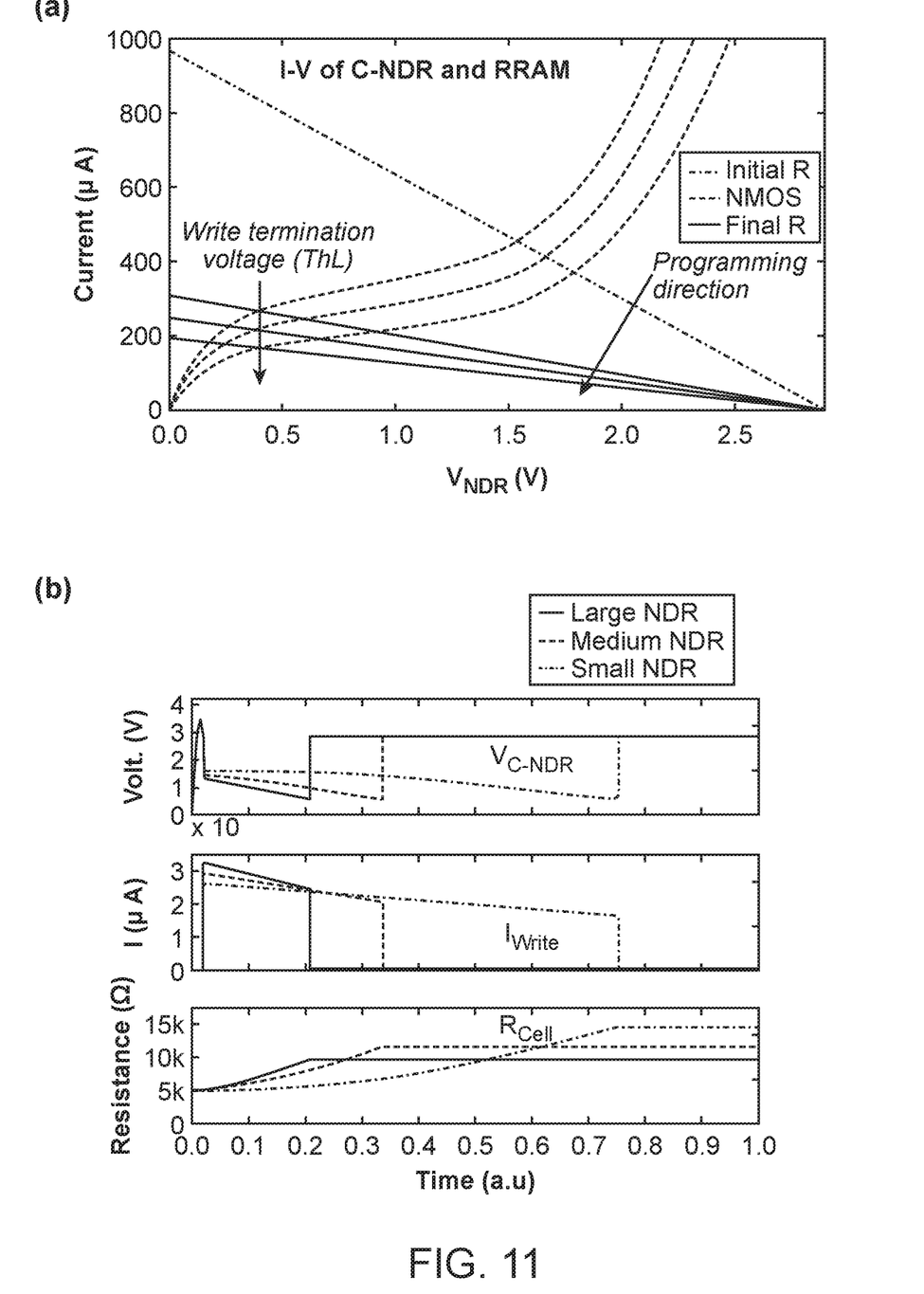

To program a CBM cell resistance, a C-NDR device is connected with the cell in series. To start the programming, a short voltage pulse is applied to increase the $V_{NDR}$ over ThH, which turns on write current. Then the resistance increases from a low resistance value (the I-V curve in dotted line) to a high resistance value (solid lines) as shown in FIG. 11a. Once the I-V curve intersection between NMOS and cell resistance reaches ThL, the C-NDR device cuts off write current and completes the programming. The write currents ($I_{NDR}$), voltage drop in C-NDR device ($V_{NDR}$), and CBM cell resistance ($R_{Cell}$) are shown in FIG. 11b. With different sized C-NDR devices, the writes terminate at different times, and result in different final resistance values, which are determined by C-NDR devices (NMOS current and ThL of the Schmitt trigger).

The overhead of the C-NDR and V-NDR devices are low because such C-NDR and V-NDR devices can be shared by a memory block (bit-line, memory bank, and so forth). The devices can be designed with large sizes so as to have close-to-0 variation, which leads to low variation in programmed CBM cell resistance. The programming techniques can also be applied to other memories like Flash memory, CTM, MRAM, and PCM. The C-NDR can potentially also be added to the write-0 circuitry in two-level memories for write termination, complementing the write-1 termination behavior of V-NDR.

III. Conclusion

V-NDR and C-NDR are proposed to improve write efficiency, read margin, and resistance programming accuracy, and to reduce read disturbance for resistive memories like MRAM, CBM, PCM, and other threshold voltage-based memories like Flash and CTM. An improved STT-MRAM write and read circuitry design is shown with the assistance of V-NDR devices as an example. In a write-to-P operation, a V-NDR device can detect the MTJ state and cuts off current flow after switching to avoid wasting energy. In a read operation, a V-NDR device can amplify the sensing current and voltage margin by detecting current through P and AP state MTJs, reducing read voltage and read energy. Additionally, read disturbance can also be reduced by NDR devices to low valley current values, mitigating against false switching. Circuit simulations show write energy reduction over about 50%, read margin improvements of over about 3×, and read disturbance reduction over about 100,000×. A precise resistance programing in CBM is shown with both V-NDR and C-NDR devices. The target resistance can be precisely programmed by sizing and modulating the bias of NDR devices. The NDR-assisted design introduces low circuit overhead, since each NDR device can be shared by multiple memory cell bit-lines, and does not require changes in the memory architecture. The device specification for NDR devices is also low; for example, in the case of STT-MRAM, NDR devices with PVR>about 3 can yield significant improvements in write energy efficiency (>about 1.8×) and read margin (>about 2×). Although some embodiments are described in the context of STT-MRAM and CBM as particular example applications, it is noted that embodiments are generally applicable to other resistive switching memories and threshold voltage switching memories.

IV. Example Embodiments

In some embodiments, a RAM memory includes a RAM sub-block which includes 1) a bit-line; 2) a source-line; 3) a resistive memory cell connected to the bit-line and the source-line; and 4) a read/write circuit connected to the bit-line and the source-line and including a NDR device.

In some embodiments, a NDR device is connected in series with a resistive memory cell.

In some embodiments and during a read operation, a read/write circuit is configured to generate a read current through a resistive memory cell, and a NDR device is connected in series with a path of the read current.

In some embodiments and during a write operation, a read/write circuit is configured to generate a write current through a resistive memory cell, and a NDR device is connected in series with a path of the write current.

In some embodiments, a direction of a read current is opposite to that of a write current.

In some embodiments, a read/write circuit further includes a sensing circuit connected to a bit-line, and the sensing circuit is configured to compare a voltage on the bit-line to a reference voltage.

In some embodiments, a read/write circuit further includes a pre-charge transistor connected in parallel or in series with a NDR device.

In some embodiments, a NDR device is a V-NDR device, which can be a semiconductor device, like TDs, TFETs, and so forth, or emulator circuits which provide NDR across its output terminals. For improved performance in write and read applications, V-NDR characteristics can be designed for a resistive memory cell with three stable solutions when the resistive memory cell is in its high resistance state and one stable solution in its low resistance state. This allows a current to be drastically reduced when the memory cell is in its low resistance state and effectively amplifies the voltage and current difference (margin) between the two states of the memory cell.

Some embodiments provide one or more of the following advantages:

1) Write termination using V-NDR for a single-level-cell resistive memory, of which MRAM is an example, so that when a memory cell is switched to its low resistance state, a write current is significantly reduced.

2) Read margin improvement using V-NDR, which amplifies voltage and current differences between memory states.

3) Read disturbance reduction because a disturbance read current can be reduced to a low value, while higher read margin is still made available by V-NDR.

4) Use of C-NDR to provide write termination when a memory cell is switched towards its higher resistance state.

5) C-NDR implementation using a Schmitt trigger and an NMOS or a PMOS device.

6) Precise programming using V-NDR and C-NDR for multi-level-cell memories like CBM, PCM, Flash, CTM, and MRAM. This is accomplished by using multiple V-NDR and C-NDR and/or by changing the control bias of V-NDR or C-NDR, such that the selected V-NDR or C-NDR device has its NDR characteristics optimized for a target resistance of a memory cell.

7) Precise programming using V-NDR and C-NDR for multi-level analog computing memory.

As used herein, the singular terms "a," "an," and "the" may include plural referents unless the context clearly dictates otherwise. Thus, for example, reference to an object may include multiple objects unless the context clearly dictates otherwise.

As used herein, the term "set" refers to a collection of one or more objects. Thus, for example, a set of objects can include a single object or multiple objects.

As used herein, the terms "connect," "connected," and "connection" refer to an operational coupling or linking. Connected objects can be directly coupled to one another or can be indirectly coupled to one another, such as via one or more other objects.

As used herein, the terms "substantially" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified. For example, a range of about 1 to about 200 should be understood to include the explicitly recited limits of about 1 and about 200, but also to include individual values such as about 2, about 3, and about 4, and sub-ranges such as about 10 to about 50, about 20 to about 100, and so forth.

While the disclosure has been described with reference to the specific embodiments thereof, it should be understood by those skilled in the art that various changes may be made and equivalents may be substituted without departing from the true spirit and scope of the disclosure as defined by the appended claims. In addition, many modifications may be made to adapt a particular situation, material, composition of matter, method, operation or operations, to the objective, spirit and scope of the disclosure. All such modifications are intended to be within the scope of the claims appended hereto. In particular, while certain methods may have been described with reference to particular operations performed in a particular order, it will be understood that these operations may be combined, sub-divided, or re-ordered to form an equivalent method without departing from the teachings of the disclosure. Accordingly, unless specifically indicated herein, the order and grouping of the operations are not a limitation of the disclosure.

What is claimed is:

1. A random access memory (RAM) comprising:
   a bit-line;
   a source-line;
   a memory cell connected to the bit-line and the source-line; and
   a read/write circuit connected to the bit-line and the source-line and including a negative differential resistance (NDR) device.

2. The RAM of claim 1, wherein the memory cell is a resistive memory cell.

3. The RAM of claim 1, wherein the NDR device is connected in series with the memory cell with a path of a current.

4. The RAM of claim 1, wherein, during a read operation, the read/write circuit is configured to generate a read current through the memory cell, and the NDR device is connected in series with a path of the read current.

5. The RAM of claim 1, wherein, during a write operation, the read/write circuit is configured to generate a write current through the memory cell, and the NDR device is connected in series with a path of the write current.

6. The RAM of claim 1, wherein the read/write circuit further includes a sensing circuit connected to the bit-line, and the sensing circuit is configured to compare a voltage on the bit-line to a reference voltage.

7. The RAM of claim 1, wherein the memory cell is a resistive memory cell, and the NDR device is a voltage-controlled NDR (V-NDR) device, in which V-NDR characteristics are configured for the resistive memory cell with multiple stable solutions when the resistive memory cell is in its high resistance state and one stable solution when the resistive memory cell is in its low resistance state.

8. The RAM of claim 1, wherein the memory cell is a resistive memory cell, and the NDR device is a V-NDR device to provide write termination when the resistive memory cell is switched to its low resistance state.

9. The RAM of claim 1, wherein the memory cell is a resistive memory cell, and the NDR device is a current-controlled NDR (C-NDR) device to provide write termination when the resistive memory cell is switched to its high resistance state.

10. The RAM of claim 1, wherein the NDR device is a C-NDR including a Schmitt trigger and a metal-oxide-semiconductor field-effect transistor (MOSFET).

11. The RAM of claim 1, wherein the RAM comprises a spin-transfer torque (STT) magnetic RAM (STT-MRAM), and wherein the memory cell comprises a magnetic tunnel junction (MTJ) and a transistor, and wherein the NDR device comprises one of a voltage-controlled NDR device and a current-controlled NDR device that is separate from the memory cell.

12. A method of programming a multi-level-cell memory, comprising:
    providing a plurality of NDR devices having different, respective NDR characteristics;
    selectively connecting a first one of the NDR devices in series with a multi-level cell; and
    generating a write current through the multi-level cell and the first one of the NDR devices.

13. The method of claim 12, wherein a number of the NDR devices is at least 3.

14. The method of claim 12, wherein the NDR devices have different, respective peak currents.

15. The method of claim 12, further comprising:
    selectively connecting a second one of the NDR devices in series with the multi-level cell; and
    generating a write current through the multi-level cell and the second one of the NDR devices.

16. The method of claim 15, further comprising:
    selectively connecting a third one of the NDR devices in series with the multi-level cell; and
    generating a write current through the multi-level cell and the third one of the NDR devices.

17. A method of programming a multi-level-cell memory, comprising:
    providing a NDR device connected in series with a multi-level cell, the NDR device being tunable according to a control bias;
    applying the control bias to the NDR device to specify a first NDR characteristic of the NDR device; and
    generating a write current through the multi-level cell and the NDR device having the first NDR characteristic to program the multi-level cell to a first state.

18. The method of claim 17, further comprising:
    applying the control bias to the NDR device to specify a second NDR characteristic of the NDR device; and
    generating a write current through the multi-level cell and the NDR device having the second NDR characteristic to program the multi-level cell to a second state.

19. The method of claim 18, further comprising:
    applying the control bias to the NDR device to specify a third NDR characteristic of the NDR device; and
    generating a write current through the multi-level cell and the NDR device having the third NDR characteristic to program the multi-level cell to a third state.

* * * * *